(12) United States Patent
Lai et al.

(10) Patent No.: US 8,378,410 B2
(45) Date of Patent: **\*Feb. 19, 2013**

(54) SEMICONDUCTOR DEVICE AND METHOD OF MANUFACTURING THE SAME

(75) Inventors: Sheng-Chih Lai, Taichung (TW); Hang-Ting Lue, Hsinchu (TW)

(73) Assignee: Macronix International Co., Ltd. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/489,611

(22) Filed: Jun. 6, 2012

(65) Prior Publication Data

US 2012/0235225 A1    Sep. 20, 2012

Related U.S. Application Data

(60) Division of application No. 13/032,836, filed on Feb. 23, 2011, now Pat. No. 8,207,571, which is a continuation of application No. 11/898,528, filed on Sep. 13, 2007, now Pat. No. 7,910,981.

(30) Foreign Application Priority Data

Oct. 3, 2006  (TW) .................. 95136772 A

(51) Int. Cl.
    *H01L 29/66* (2006.01)
(52) U.S. Cl. . 257/325; 257/316; 257/326; 257/E29.309; 438/264; 438/266; 438/257; 438/778
(58) Field of Classification Search .................. 257/316, 257/295, 325–326, E29.309; 438/264, 266, 438/257, 778, 591, 783
See application file for complete search history.

(56) References Cited

U.S. PATENT DOCUMENTS

| | | | |
|---|---|---|---|
| 5,141,603 A | 8/1992 | Dickey et al. | |
| 6,512,696 B1 | 1/2003 | Fan et al. | |
| 6,946,347 B2 | 9/2005 | Gilton | |
| 2002/0086556 A1* | 7/2002 | Ahn et al. | 438/785 |
| 2004/0051134 A1 | 3/2004 | Jang et al. | |
| 2004/0125629 A1 | 7/2004 | Scheuerlein et al. | |
| 2005/0157549 A1 | 7/2005 | Mokhlesi et al. | |
| 2006/0088987 A1 | 4/2006 | Yeo et al. | |
| 2006/0093833 A1 | 5/2006 | Meyer et al. | |
| 2006/0211205 A1* | 9/2006 | Jeon et al. | 438/264 |

FOREIGN PATENT DOCUMENTS

| | | |
|---|---|---|
| CN | 1148262 A | 4/1997 |
| CN | 1282098 A | 1/2001 |
| CN | 1755915 A | 4/2006 |
| CN | 1825628 A | 8/2006 |
| TW | 200537621 A | 11/2005 |

OTHER PUBLICATIONS

T.Y. Chan et al., "A True Single-Transistor Oxide-Nitride-Oxide EEPROM Device," IEEE Electron Device Letters, vol. EDL-8, No. 3, Mar. 1987, pp. 93-95.
I. Kh. Abdukadyrova, "Radiation Effects in Corundum Single Crystals," Atomic Energy, vol. 96, No. 6, 2004, pp. 439-442.

\* cited by examiner

*Primary Examiner* — Evan Pert
*Assistant Examiner* — Mark A Laurenzi
(74) *Attorney, Agent, or Firm* — Bacon & Thomas, PLLC

(57) ABSTRACT

A semiconductor device having a non-volatile memory and a method of manufacturing the same are provided. The semiconductor device includes a base material and a stack structure. The stack structure disposed on the base material at least includes a tunneling layer, a trapping layer and a dielectric layer. The trapping layer is disposed on the tunneling layer. The dielectric layer has a dielectric constant and is disposed on the trapping layer. The dielectric layer is transformed from a first solid state to a second solid state when the dielectric layer undergoes a process.

16 Claims, 7 Drawing Sheets

SEMICONDUCTOR DEVICE AND METHOD OF MANUFACTURING THE SAME

This application is a divisional application of co-pending U.S. application Ser. No. 13/032,836, filed Feb. 23, 2011, which is a continuation application of U.S. application Ser. No. 11/898,528, filed Sep. 13, 2007 (now U.S. Pat. No. 7,910,981, issued Mar. 22, 2011), which claims the benefit of Taiwan application Serial No. 95136772, filed Oct. 3, 2006. These related applications are incorporated herein by reference.

BACKGROUND OF THE INVENTION

1. Field of the Invention

The invention relates in general to a semiconductor device and a method of manufacturing the same, and more particularly to a semiconductor device having a non-volatile memory and a method of manufacturing the same.

2. Description of the Related Art

A non-volatile memory (NVM) is a memory that can store information even when not powered. Examples of non-volatile memory include a read-only memory (ROM) and a flash memory according to whether the stored data can be modified or not. Data is written into the ROM during initial manufacturing process. Once the ROM is completed, the ROM can only be read, and the stored data cannot be changed or removed. On the contrary, the flash memory is programmed, erased or read by providing voltage. In other words, data stored in the flash memory can be removed or rewritten anytime whenever a user wants to. Flash memories are applied to various consumer electronics due to the advantages of compact size, light weight and low electricity consumption.

Lately, owing to the requirements of lightweight and multi-function consumer electronic products, the electronic products need to be smaller, lighter and more efficient. However, the efficiency of the electronic product utilizing a flash memory as the storage media is affected by the programming/erasing rate of the memory.

Generally, in the silicon-oxide-nitride-oxide-silicon (SONOS) stack structure of the flash memory, a first silicon dioxide ($SiO_2$) layer, a silicon nitride (SiN) layer, a second silicon dioxide ($SiO_2$) layer and a polysilicon layer are formed on a semiconductor substrate orderly. Data stored in the memory depends on the electrons in the silicon nitride layer. By applying voltage among a control gate, a drain, a source and the silicon substrate, a strong electric field is generated for removing or accumulating electrons in the silicon nitride layer. As a result, the data stored in the memory can be changed. In the erase operation, electrons stored in the silicon nitride layer are removed. In the programming operation, electrons are accumulated in the silicon nitride layer. In the SONOS stack structure, the thickness of the first silicon dioxide layer has to be less than 3 nanometers (nm) for maintaining the Fowler-Nordheim erase rate. The thin first dioxide layer (such as 2 nm to 3 nm) facilitates the erase operation, such as channel hole injection. However, the electrons or holes are still injected from the channel even when the electric field is low. The thin first silicon dioxide layer also increases the possibility of losing electrons or holes stored in the silicon nitride. As a result, data retention property of the memory is degraded.

In the above-described SONOS stack structure, the data erase rate affects the operation efficiency of the memory significantly. Therefore, it is very important to increase the data erase rate of the memory effectively for improving the operation efficiency of the flash memory and to maintain good data retention ability of the memory at the same time.

SUMMARY OF THE INVENTION

The invention is directed to a semiconductor device having a non-volatile memory and a method of manufacturing the same. A dielectric layer of the memory is made of crystalline aluminum oxide. The non-volatile memory has advantages including lowering operation voltage, increasing erase rate and having good data retention.

According to the present invention, a semiconductor device having a non-volatile memory including a base material and a stack structure is provided. The stack structure disposed on the base material at least includes a tunneling layer, a trapping layer and a dielectric layer. The trapping layer is disposed on the tunneling layer. The dielectric layer is disposed on the trapping layer. The dielectric layer has a dielectric constant and is transformed from a first solid state to a second solid state when the dielectric layer undergoes a process.

According to the present invention, a method of manufacturing a semiconductor device having a non-volatile memory is provided. The method includes following steps. First, a base material is provided. Next, a tunneling layer is formed on the base material. Then, a trapping layer is formed on the tunneling layer. Afterward, a dielectric layer is formed on the trapping layer. The dielectric layer has a dielectric constant and is transformed from a first solid state to a second solid state through a process.

The invention will become apparent from the following detailed description of the preferred but non-limiting embodiments. The following description is made with reference to the accompanying drawings.

DETAILED DESCRIPTION OF THE INVENTION

Figure 1:
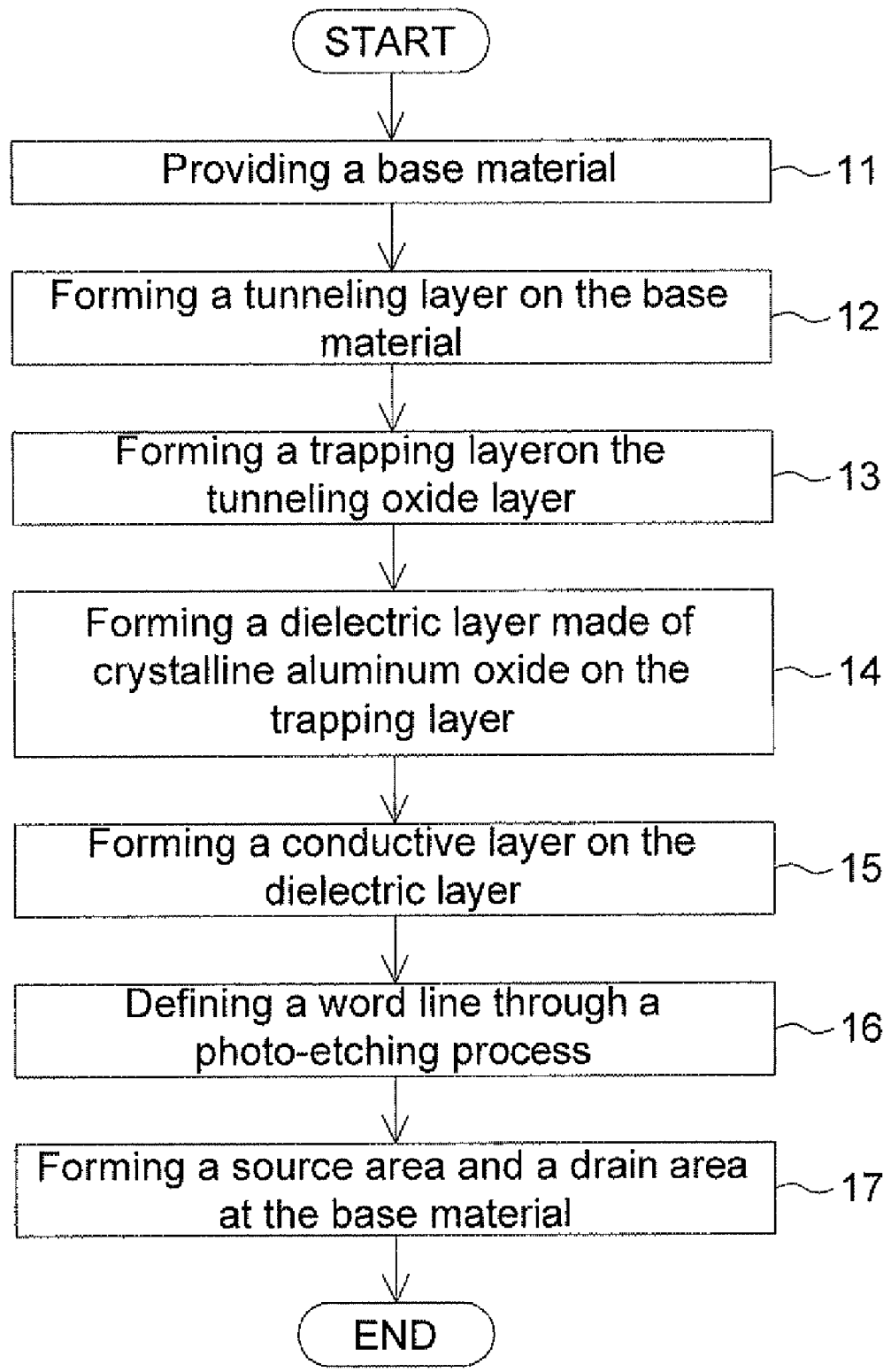
FIG. 1 is a flow chart of the method of manufacturing a semiconductor device having a non-volatile memory according to a preferred embodiment of the present invention.

Referring to FIG. 1 and FIGS. 2A~2G at the same time. FIG. 1 is a flow chart of a method of manufacturing a semiconductor device having a non-volatile memory according to a preferred embodiment of the present invention. FIGS. 2A~2G illustrate steps 11~17 in FIG. 1. First, as shown in step 11 and FIG. 2A, a base material 21 is provided. For example, the base material 21 is a p-type substrate or an n-type substrate.

Next, in step 12, a tunneling layer 22 is formed on the base material 21. In the present embodiment, the tunneling layer 22 is made of silicon dioxide for example, and its thickness is substantially greater than 3 nanometers (nm).

Figure 2A:
FIG. 2A illustrates the step 11 in FIG. 1.
Figure 2B:
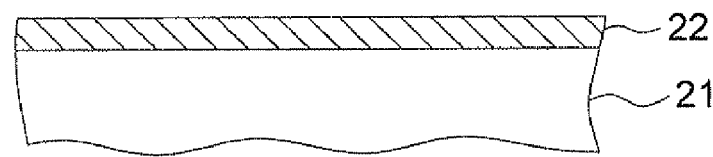
FIG. 2B illustrates the step 12 in FIG. 1.
Figure 2C:
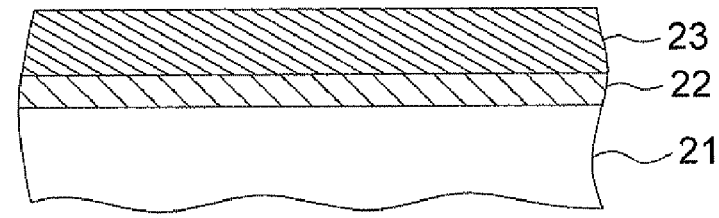
FIG. 2C illustrates the step 13 in FIG. 1.

Then, in step 13, a trapping layer 23 is formed on the tunneling layer 22, as shown in FIG. 2C. The trapping layer 23 is formed by low pressure chemical vapor deposition (LPCVD) for example. The trapping layer 23 is preferably made of silicon nitride, and its thickness is substantially between 3 nm and 10 nm.

Figure 2D:
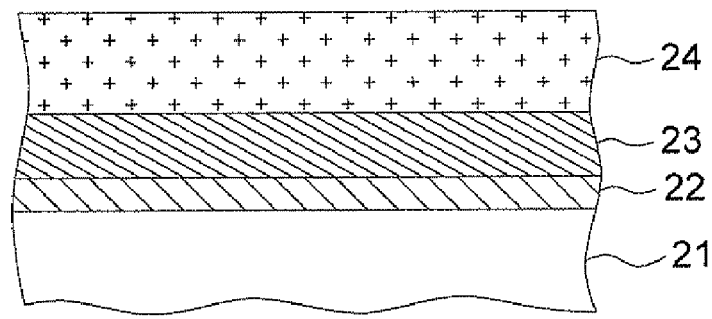
FIG. 2D illustrates the step 14 in FIG. 1.

Afterward, as shown in step 14 and FIG. 2D, a dielectric layer 24 is formed on the trapping layer 23. The dielectric layer 24 is formed by atomic layer deposition (ALD) for example. The dielectric layer 24 is preferably made of crystalline aluminum oxide. The dielectric constant of the dielectric layer is preferably greater than 6, and the thickness is substantially between 7 nm and 20 nm.

Figure 2E:
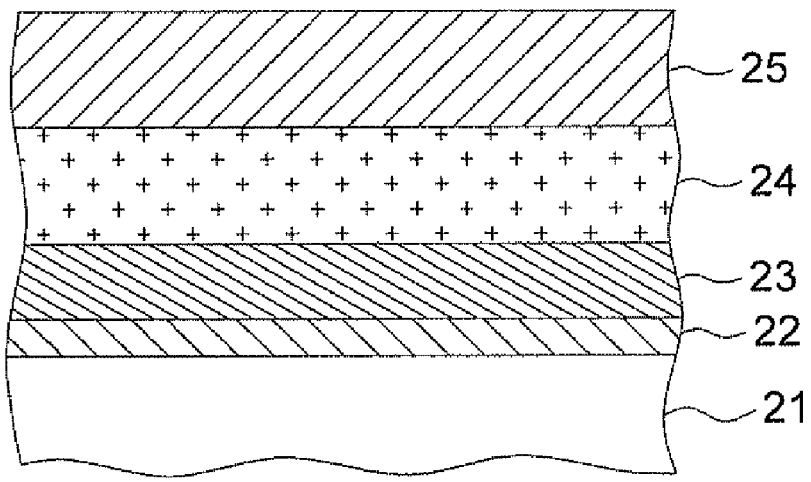
FIG. 2E illustrates the step 15 in FIG. 1.

Later, in step 15, a conductive layer 25 is formed on the dielectric layer 24, as shown in FIG. 2E. The conductive layer 25 is preferably made of platinum. Platinum has high work function and therefore can reduce gate-injected electrons during FN erase. However, the material of the conductive layer 25 is not limited thereto. For example, the conductive layer 25 can also be made of polysilicon, iridium, ruthenium or other suitable metals.

Figure 2F:
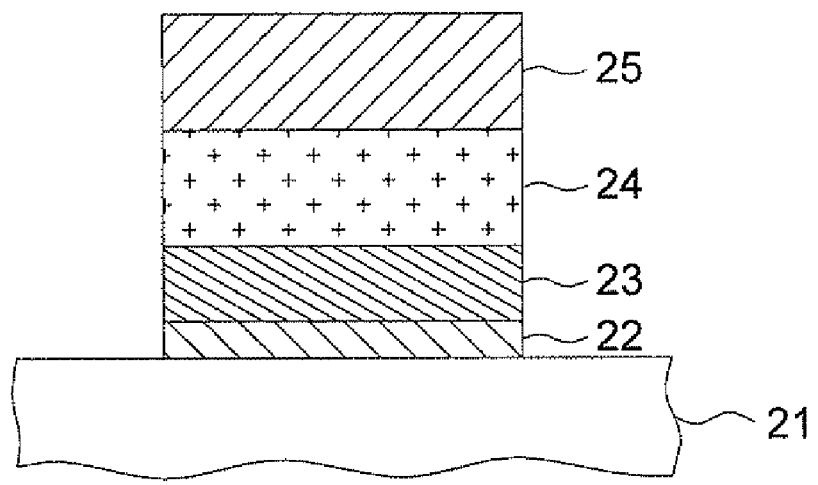
FIG. 2F illustrates the step 16 in FIG. 1.

Subsequently, in step 16, a word line is defined through a photo-etching process, as shown in FIG. 2F.

Figure 2G:
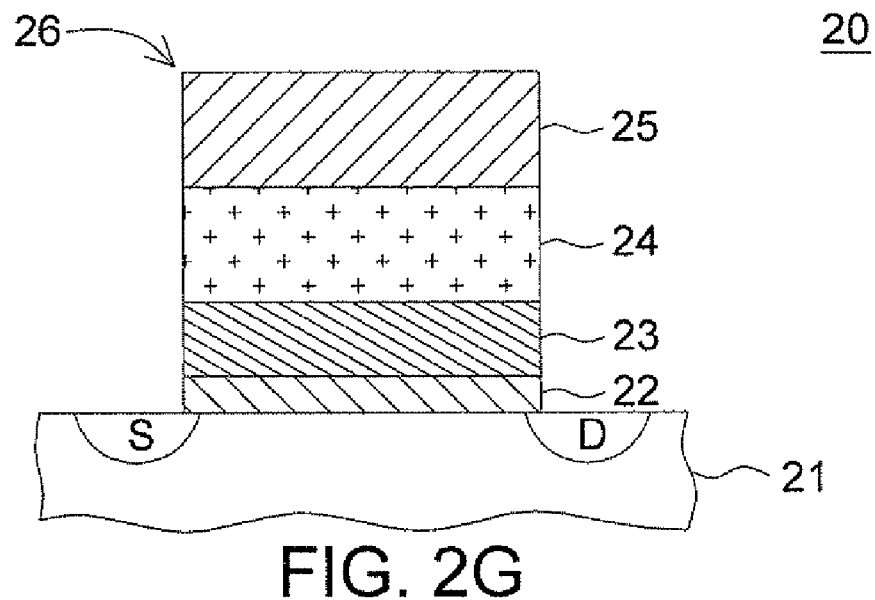
FIG. 2G illustrates the step 17 in FIG. 1.

Thereon, in step 17, a source area S and a drain area D are formed at the base material 21. The tunneling layer 22, the trapping layer 23, the dielectric layer 24 and the conductive layer 25 form a stack structure 26 of the non-volatile memory 20. As shown in FIG. 2G, the source area S and the drain area D are positioned on two sides of the stack structure 26. The semiconductor device according to the present embodiment mainly includes the non-volatile memory 20. Besides that, peripheral elements (not shown in the drawings), such as CMOS, can be provided on the base material 21 in the vicinity of the non-volatile memory 20.

The base material 21, the tunneling layer 22, the trapping layer 23, the dielectric layer 24 and the conductive layer 25 form the non-volatile memory 20 according to the preferred embodiment of the present invention. The non-volatile memory 20 is preferably applied in a semiconductor device.

Figure 3:
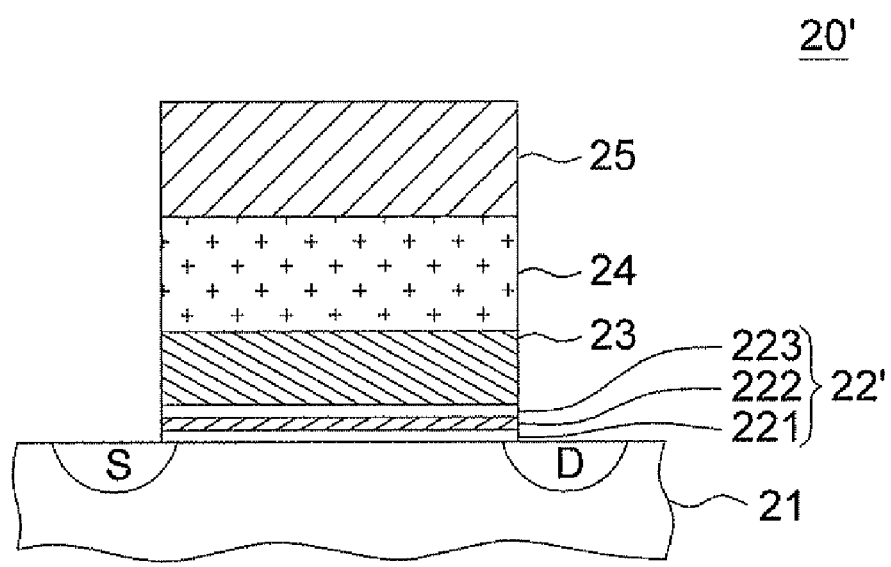
FIG. 3 illustrates the non-volatile memory having another tunneling layer structure
Figure 4:
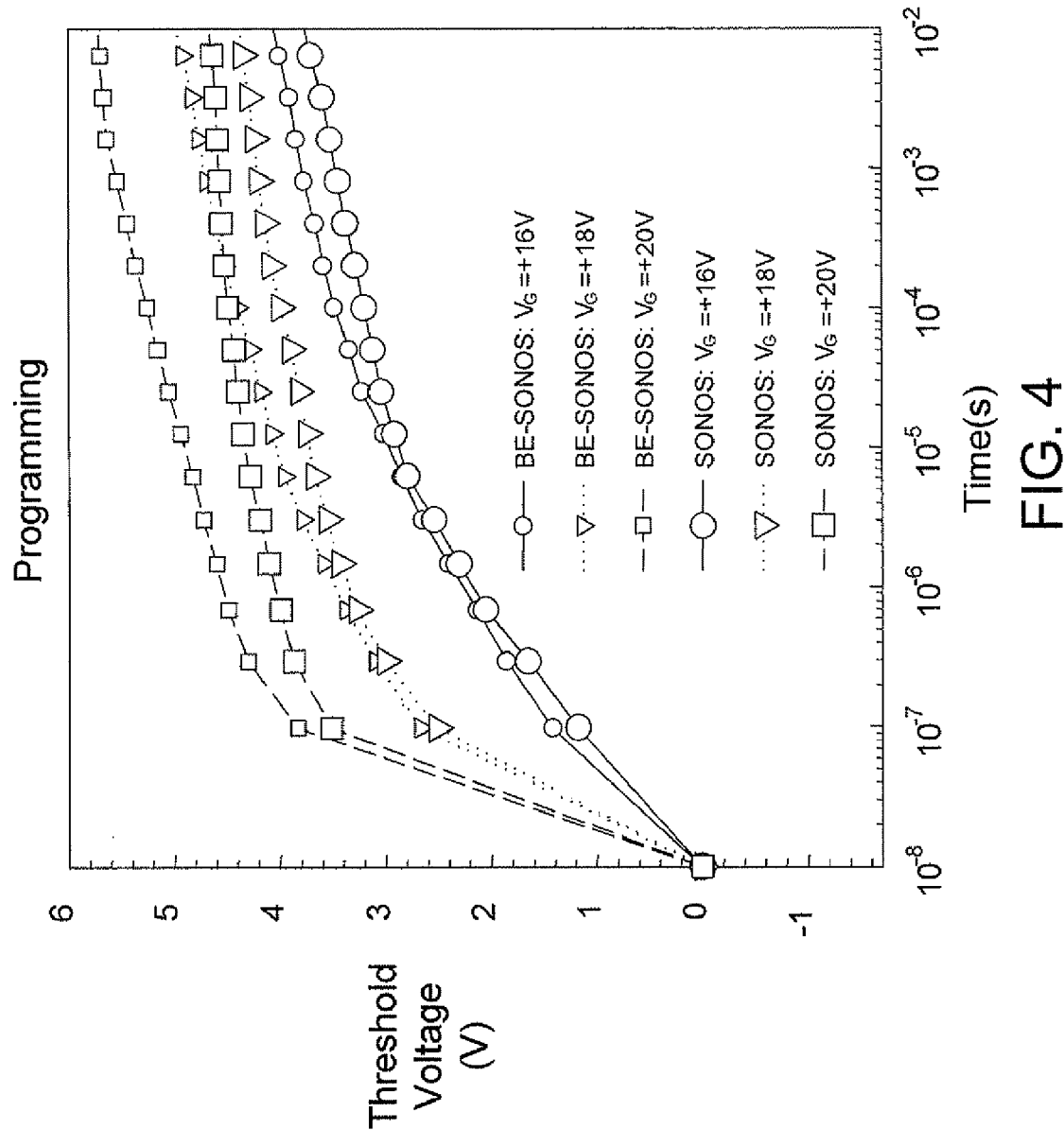
FIG. 4 shows the programming properties of a memory with
BE-SONOS structure and that of a conventional SONOS memory.
Figure 5:
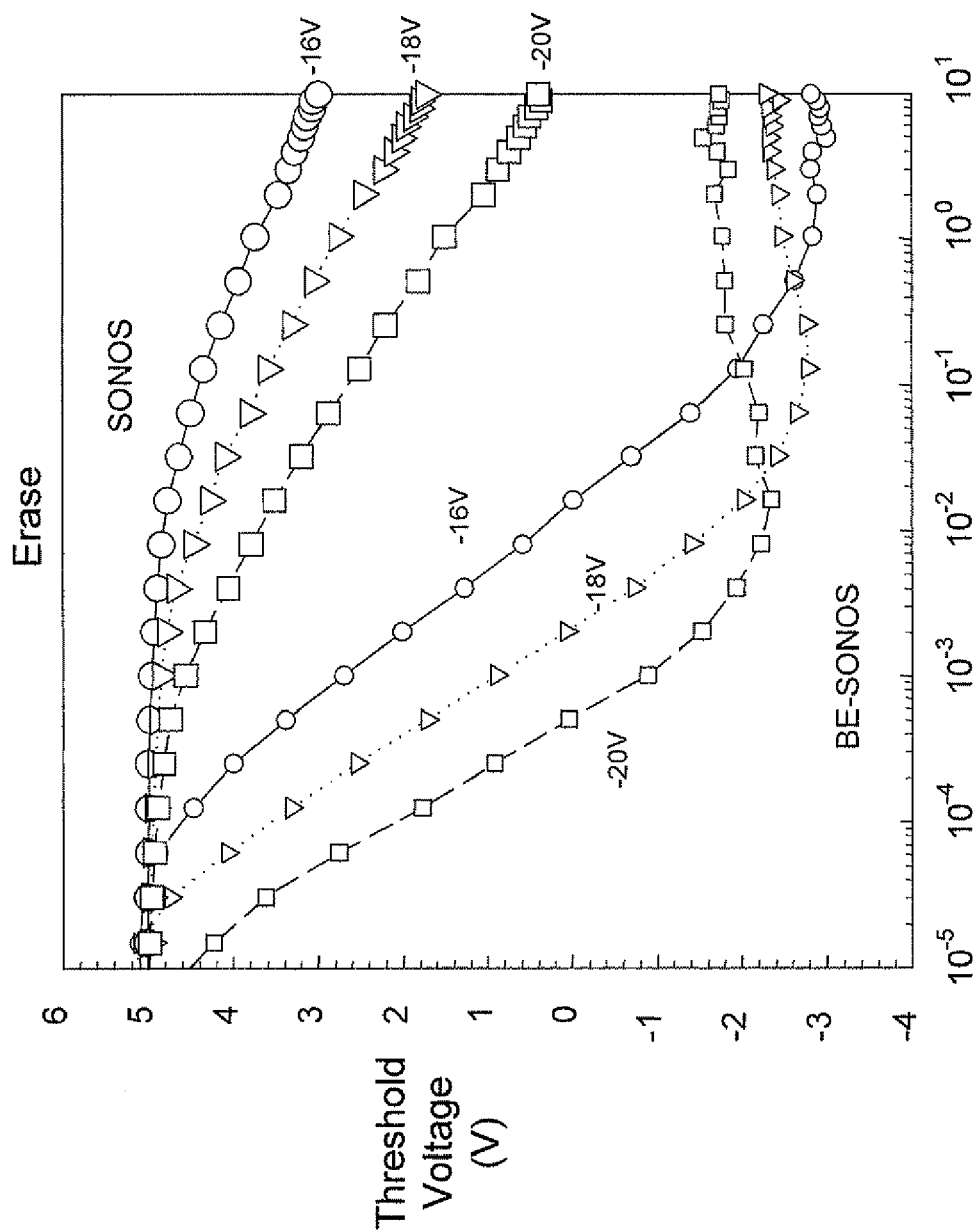
FIG. 5 shows the erase properties of a memory with BE-SONOS structure and that of a conventional SONOS memory.

The conductive layer 25 is utilized as a control gate of the non-volatile memory 20. In this embodiment, the tunneling layer 22 is exemplified by a single silicon dioxide layer. However, the tunneling layer 22 can also be a multilayer structure. Referring to FIG. 3, the non-volatile memory having another tunneling layer structure is illustrated. The tunneling layer 22' of the non-volatile memory 20' includes a first oxide layer 221, a nitride layer 222 and a second oxide layer 223. The first and second oxide layers 221 and 223 and the nitride layer 222 form a bandgap engineered tunnel structure. In the present embodiment, the ONONO structure of the dielectric layer 24, the trapping layer 23, the second oxide layer 223, the nitride layer 222 and the first oxide layer 221 constructs a bandgap engineered silicon-oxide-nitride-oxide-silicon (BE-SONOS) structure. The first oxide layer 221 is a silicon dioxide layer for example, and has a thickness substantially less than 2 nm or in the range of 0.5~2 nm. In another embodiment, the thickness of the first silicon layer 221 is substantially less than 1.5 nm. In one embodiment, the nitride layer 222 is a silicon nitride layer and has a thickness substantially less than 2 nm, yet the thickness of the nitride layer 222 can also be in the range of 1~2 nm. In one embodiment, the second oxide layer 223 is also a silicon dioxide layer and has a thickness substantially less than 2 nm. The thickness of the second oxide layer 223 is in the range of 1.5~2 nm in another embodiment. Please refer to FIG. 4 and FIG. 5 at the same time. FIG. 4 shows the programming properties of a memory with BE-SONOS structure and that of a conventional SONOS memory. FIG. 5 shows the erase properties of a memory with BE-SONOS structure and that of a conventional SONOS memory. For example, when the memory with BE-SONOS structure and the memory with conventional SONOS structure are both applied with a gate voltage of +16V during programming, the memory with BE-SONOS structure raises the threshold voltage faster than the memory with conventional SONOS structure, as shown in FIG. 4. The differentiation of the increasing rate of the threshold voltages are similar in the case of applying +18V and +20V of gate voltages.

On the other hand, while applying with the same gate voltage during erasing, the memory with BE-SONOS structure lowers the threshold voltage more efficiently than the memory with conventional SONOS structure, as shown in FIG. 5. Therefore, the efficiency of the programming operation and the erase operation is increased. Furthermore, because the non-volatile memory 20' of the present embodiment applied with BE-SONOS structure can be erase to a negative threshold voltage, a very large memory window can be achieved, ideal for multi-level cell (MLC) NAND application.

In step 14 of FIG. 1, the crystalline aluminum oxide is preferably formed by following steps. First, an aluminum oxide layer is deposited on the trapping layer 23, and then the aluminum oxide layer is annealed at the temperature about 800° C. to 1200° C. More preferably, the aluminum oxide layer undergoes a post deposition annealing process at the temperature substantially between 850° C. and 950° C. in nitrogen. After post deposition annealing for 60 seconds, the aluminum oxide layer is transformed from an amorphous first solid state to a crystalline second solid state. However, anyone who has ordinary skill in the field of the present invention can understand that the present invention is not limited thereto. Any method for crystallizing aluminum oxide on the trapping layer 23 can be applied to the present embodiment of the invention.

Figure 6:
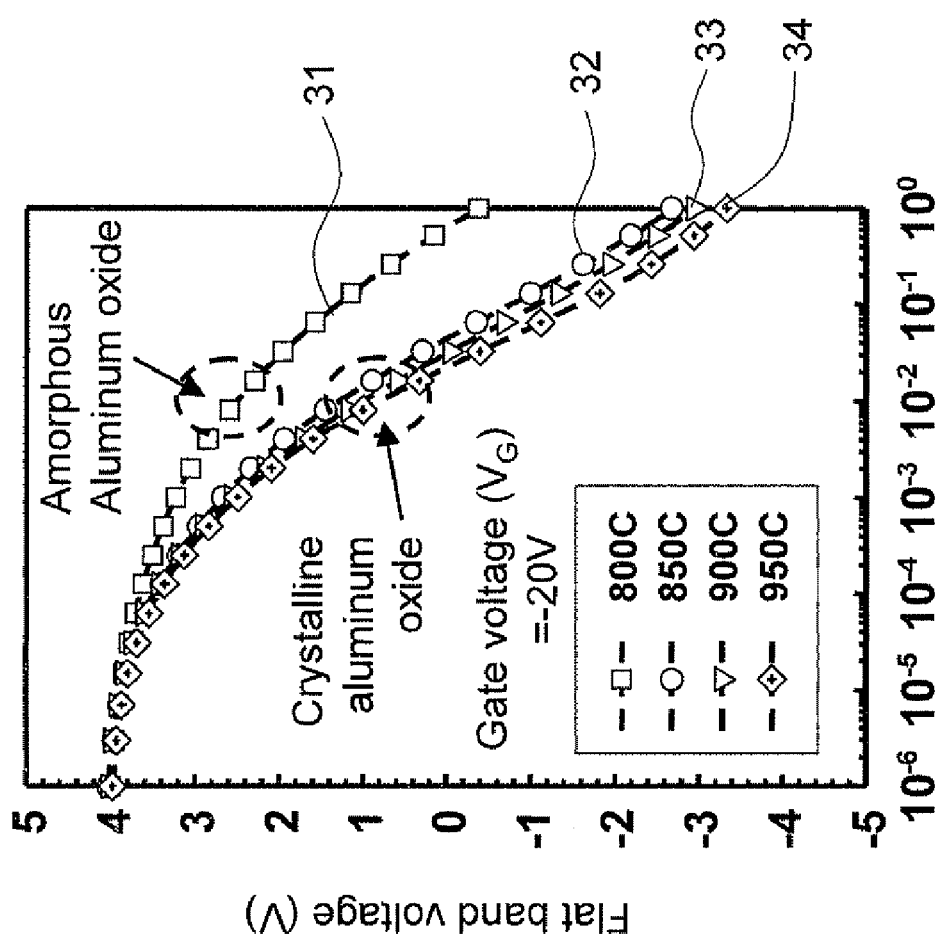
FIG. 6 shows erase properties of the non-volatile memory when annealing of the dielectric layer is performed at different temperatures.

When the dielectric layer 24 is transformed from the first solid state to the second solid state, the erase rate of the non-volatile memory 20 changes from a first rate to a second rate. The second rate is greater than the first rate. Please refer to FIG. 6 at the same time. FIG. 6 shows erase properties of the non-volatile memory when annealing of the dielectric layer in FIG. 2G is performed at different temperatures. The gate voltage (VG) applied to the conductive layer 25 is −20V. Furthermore, it is known from experiments that crystallization of aluminum oxide occurs more obviously at approximately 850° C. The curve 31 shows the erase property of amorphous aluminum oxide when annealing of the dielectric layer 24 of the stack structure is performed at 800° C. The curves 32, 33 and 34 show the erase properties of crystalline aluminum oxide when annealing of the dielectric layer 24 is performed at 850° C., 900° C. and 950° C. respectively. As shown in FIG. 6, when the flat band voltage (VFB) is the same, the higher temperature the annealing of the aluminum oxide dielectric layer 24 is performed at, the shorter time it takes to return to the flat band state. In other words, when annealing is performed at high temperature, the aluminum oxide dielectric layer 24 is well crystallized, and thus the non-volatile memory can have higher erase rate.

In a semiconductor device having the non-volatile memory and the method of manufacturing the same according to the preferred embodiment of the present invention, the dielectric layer is made of crystalline aluminum oxide for example and formed on the trapping layer. The crystalline aluminum oxide layer increases the erase rate of the non-volatile memory, so the efficiency of the entire non-volatile memory is increased. Accordingly, the efficiency of electronic products using the non-volatile memories of the present invention is improved. Furthermore, there is no need to add any additional structure or material in the conventional non-volatile memory to manufacture the non-volatile memory according to the preferred embodiment of the present invention. As a result, the manufacturing cost will not be increased. Compared to the conventional manufacturing method, the method of manufacturing the non-volatile memory according to the preferred embodiment of the present invention only adds a step of crystallizing the aluminum oxide dielectric layer. Therefore, the method of manufacturing the non-volatile memory of according to the preferred embodiment is compatible with the conventional method of manufacturing a SONOS stack structure and can be applied to a method of manufacturing a conventional NAND flash memory. Besides, the erase operation time of the non-volatile memory according to the preferred embodiment of the present invention is reduced. Therefore, the non-volatile memory of the present invention can have thicker (more than about 3 nm) tunneling layer and lower threshold voltage. As a result, the data retention property of the memory is improved. In addition, the tunneling layer can be adopted in the form of a BE-SONOS structure, so as to enhance the reliability and performance of the non-volatile memory.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A device comprising:
   a base material; and
   a stack structure disposed on the base material, the stack structure at least comprising:
      first and second dielectric layers; and
      a charge storage layer between the first and second dielectric layers;
   wherein the first dielectric layer has a first state which is transformed from a second state through a process, the first dielectric layer is non-conductive in the first and second states, a threshold-voltage change rate of the device changes from a first rate to a second rate when the first dielectric layer is transformed from the first state to the second state, and the second rate is greater than the first rate.

2. The device according to claim 1, wherein the process is an annealing step at about 800° C. to 1200° C.

3. The device according to claim 1, wherein the first state is an amorphous state and the second state is a crystalline state.

4. The device according to claim 3, wherein the threshold-voltage change rate of the device is an erase rate of a non-volatile memory of the device.

5. The device according to claim 4, wherein the first dielectric layer is a crystalline aluminum oxide layer.

6. The device according to claim 1, wherein a dielectric constant of the first dielectric layer is substantially greater than 3.9.

7. The device according to claim 1, wherein the stack structure further comprises a conductive layer disposed on the first dielectric layer for being a control gate of a non-volatile memory of the device.

8. The device according to claim 7, wherein the conductive layer is a platinum layer, an iridium layer, a ruthenium layer, or a polysilicon layer.

9. The device according to claim 1, wherein the thickness of the charge storage layer is substantially greater 3 nanometers and less than 10 nanometers.

10. The device according to claim 1, wherein the thickness of the first dielectric layer is substantially greater than 7 nanometers and less than 20 nanometers.

11. The device according to claim 1, wherein the stack structure comprises a tunneling layer on the base material, the tunneling layer comprises the second dielectric layer, and the charge storage layer is disposed on the tunneling layer.

12. The device according to claim 11, wherein the thickness of the tunneling layer is substantially greater than 3 nanometers.

13. The device according to claim 11, wherein the tunneling layer further comprises:
   a first oxide layer disposing on the base material; and
   a nitride layer disposing on the first oxide layer, wherein the second dielectric layer is disposed on the nitride layer.

14. The device according to claim 11, wherein the tunneling layer further comprises:
   a first oxide layer of a thickness substantially less than 2 nanometers disposing on the base material; and
   a nitride layer disposing on the first oxide layer, wherein the second dielectric layer is disposed on the nitride layer.

15. The device according to claim 11, wherein the tunneling layer further comprises:
   a first oxide layer disposing on the base material; and
   a nitride layer of a thickness substantially less than 3 nanometers disposing on the first oxide layer, wherein the second dielectric layer is disposed on the nitride layer.

16. The device according to claim 11, wherein the tunneling layer further comprises:
   a first oxide layer disposing on the base material; and
   a nitride layer disposing on the first oxide layer, wherein the second dielectric layer is disposed on the nitride layer and a thickness of the second dielectric layer is substantially less than 3 nanometers.

* * * * *